United States Patent
Bauer et al.

(10) Patent No.: US 7,768,107 B2
(45) Date of Patent: Aug. 3, 2010

(54) SEMICONDUCTOR COMPONENT INCLUDING SEMICONDUCTOR CHIP AND METHOD FOR PRODUCING THE SAME

(75) Inventors: Michael Bauer, Nittendorf (DE); Alfred Haimerl, Sinzing (DE); Angela Kessler, Regensburg (DE); Joachim Mahler, Regensburg (DE); Wolfgang Schober, Amberg (DE)

(73) Assignee: Infineon Technologies AG, Munich (DE)

( * ) Notice: Subject to any disclaimer, the term of this patent is extended or adjusted under 35 U.S.C. 154(b) by 201 days.

(21) Appl. No.: 11/598,203

(22) Filed: Nov. 13, 2006

(65) Prior Publication Data
US 2007/0145552 A1      Jun. 28, 2007

(30) Foreign Application Priority Data
Nov. 11, 2005   (DE) .................. 10 2005 054 268

(51) Int. Cl.
*H01L 23/02* (2006.01)
(52) U.S. Cl. ................ 257/678; 257/E23.087; 257/E23.092
(58) Field of Classification Search ............ 257/678, 257/E23.087, E23.092
See application file for complete search history.

(56) References Cited

U.S. PATENT DOCUMENTS

| | | | |
|---|---|---|---|
| 4,620,215 A | 10/1986 | Lee | |
| 5,625,226 A | 4/1997 | Kinzer | |
| 6,184,580 B1* | 2/2001 | Lin | ............................. 257/712 |
| 6,264,093 B1* | 7/2001 | Pilukaitis et al. | ......... 228/180.1 |
| 6,265,771 B1* | 7/2001 | Ference et al. | ............... 257/706 |
| 6,770,513 B1 | 8/2004 | Vikram et al. | |
| 6,867,492 B2* | 3/2005 | Auburger et al. | ............. 257/706 |
| 2003/0080411 A1* | 5/2003 | Baek et al. | ................... 257/704 |
| 2005/0116335 A1* | 6/2005 | Karim | ......................... 257/718 |
| 2006/0094165 A1* | 5/2006 | Hedler et al. | ................ 438/141 |

FOREIGN PATENT DOCUMENTS

| | | |
|---|---|---|
| DE | 19500422 A1 | 7/1995 |
| DE | 19932442 A1 | 9/2000 |
| EP | 0488783 A2 | 6/1992 |
| WO | WO 02/061830 A1 | 8/2002 |

* cited by examiner

*Primary Examiner*—Sue Purvis
*Assistant Examiner*—Krista Soderholm
(74) *Attorney, Agent, or Firm*—Edell, Shapiro & Finnan, LLC

(57) ABSTRACT

A semiconductor component includes at least one semiconductor chip arranged on a mounting substrate and connected thereto via bonding wires. For effective dissipation of heat, a solderable interlayer is arranged on the active upper side of the semiconductor chip and a heat sink is soldered onto the solderable interlayer. A method is also described for producing a semiconductor component with a solderable interlayer disposed on an active upper side of a semiconductor chip and with a heat sink soldered to the solderable interlayer.

13 Claims, 2 Drawing Sheets

SEMICONDUCTOR COMPONENT INCLUDING SEMICONDUCTOR CHIP AND METHOD FOR PRODUCING THE SAME

CROSS REFERENCE TO RELATED APPLICATIONS

This application claims priority under 35 U.S.C. §119 to application Ser. No. DE 102005054268.9 filed on Nov. 11, 2005, entitled "Semiconductor Component Having at Least One Semiconductor Chip and Method for its Production," the entire contents of which are hereby incorporated by reference.

BACKGROUND

Heat generated during the operation of semiconductor components must be sufficiently dissipated to avoid component failure. As semiconductor components become smaller and more complex, the problem associated with the effective dissipation of heat increases.

Typically a metal heat sink is adhesively bonded onto the semiconductor chip, in which case metal particles may be added to the adhesive in order to allow better thermal conduction. It would be possible to increase the thermal conduction by soldering the heat sink directly onto the semiconductor chip. Nevertheless adhesives have hitherto been employed because the material of the semiconductor chip, for example $SiO_2$, is not solderable.

There are known methods for producing a semiconductor component in which a solderable interlayer is applied onto the inactive rear side of a flip-chip such that a metal heat sink can subsequently be soldered. This method has the advantage that it allows substantially better thermal conduction compared with applying a heat sink via an adhesive. However, the method has only limited suitability for use with a semiconductor chip which is not designed as a flip-chip, but which is arranged with its rear side on a mounting substrate and is electrically connected thereto via bonding wires.

SUMMARY

The described device relates to a semiconductor component including at least one semiconductor chip. The semiconductor chip is arranged on a mounting substrate and is connected thereto via bonding wires. For effective dissipation of heat, a solderable interlayer is arranged on the active upper side of the semiconductor chip and a heat sink is soldered onto the solderable interlayer. A method is also described for producing a semiconductor component with a solderable interlayer disposed on an active upper side of a semiconductor chip and with a heat sink soldered to the solderable interlayer.

The above and still further features and advantages of the described device and method will become apparent upon consideration of the following definitions, descriptions and descriptive figures of specific embodiments thereof, wherein like reference numerals in the various figures are utilized to designate like components. While these descriptions go into specific details of the device and method, it should be understood that variations may and do exist and would be apparent to those skilled in the art based on the descriptions herein.

BRIEF DESCRIPTION OF THE DRAWINGS

The device and method are explained in more detail below with reference to exemplary embodiments, where:

FIG. 3 shows the semiconductor chip after a heat sink has been soldered on; and

DETAILED DESCRIPTION

Figure 1:
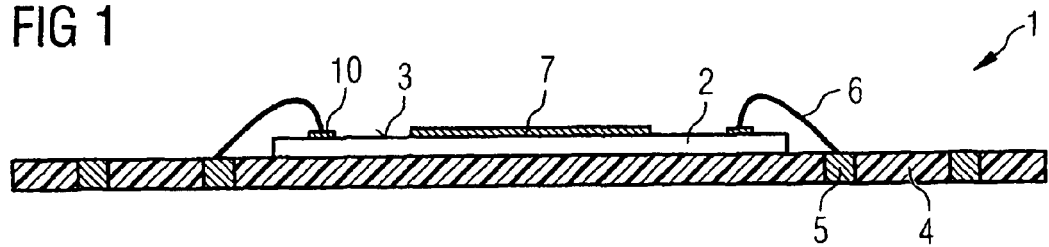
FIG. 1 shows a semiconductor chip, with a solderable interlayer on its active upper side, disposed on a mounting substrate.

The described device is a semiconductor component including a semiconductor chip, arranged on a mounting substrate and connected thereto via bonding wires, for which maximal effective thermal dissipation is ensured. Furthermore, a method for producing such a component is described herein.

A semiconductor component according to the described device including at least one semiconductor chip with an active upper side is arranged on a mounting substrate. The active upper side of the semiconductor chip comprises a plurality of electrical chip contacts which are electrically connected via bonding wires to electrical contacts of the mounting substrate. A heat sink is arranged on the active upper side of the semiconductor chip. A solderable interlayer, to which the heat sink is connected via a soldered connection, is arranged between the active upper side of the semiconductor chip and the heat sink.

The described semiconductor component is based on the idea that in a semiconductor chip contacted via bonding wires, the heat sink should be arranged not on the passive rear side but on the active upper side of the semiconductor chip. On the one hand, this arrangement is better in respect of effective thermal dissipation because the heat is dissipated precisely where it is generated, i.e., on the active upper side, and does not first have to find its way through a substrate which is a poor conductor of heat.

On the other hand, however, this arrangement also represents a particular challenge because when the solderable interlayer and the heat sink are being applied onto the active upper side, it is necessary to take into account the electrical contacts likewise arranged on the active upper side and the bonding wires being routed around the semiconductor chip onto the mounting substrate.

Advantageously, therefore, the heat sink comprises an upper part having an upper part cross-sectional area A and a lower part having a lower part cross-sectional area a, where A>a. The upper part dissipates the heat generated on the active upper side of the semiconductor chip to the surroundings; therefore the upper part has a larger cross-sectional area than the lower part. The lower part conducts the heat from the active surface into the upper part of the heat sink. The lower part shares the scarce space on the active upper side with the electrical contacts and the bonding wires. The shape of the heat sink is therefore optimally adapted in consideration of the forgoing requirements placed on it.

The solderable interlayer may for example contain nickel, a nickel-palladium alloy or copper. These materials provide a readily solderable surface and at the same time offer good thermal conduction properties.

The heat sink is advantageously electrically connected to the semiconductor chip. The semiconductor chip may then for example be grounded via the heat sink.

A rewiring substrate is advantageously provided as the mounting substrate. A lead frame may also be envisaged as the mounting substrate.

In order to protect the sensitive components against damage, particularly against corrosion damage, the semiconductor component advantageously includes a plastic package. In this case for example the semiconductor chip, the bonding wires as well as parts of the heat sink and parts of the mounting substrate are enclosed via the plastic package compound.

The upper part of the heat sink, which is intended to release the heat to the surroundings, protrudes out of the plastic package while the lower part is enclosed via the plastic package compound.

With this arrangement, on the one hand, the space required for the heat sink on the active upper side of the semiconductor chip is kept as small as possible. On the other hand, the heat sink can also be provided with a large surface area for rapidly dissipating the heat outside the plastic package, where sufficient space is available.

The semiconductor component according to the described device has the advantage that the soldered connection allows significantly improved thermal conduction compared with an adhesive, and it is furthermore possible to electrically connect the heat sink and the semiconductor chip. At the same time, the soldered connection does not absorb moisture as readily as an adhesive bond. Corrosion-induced failure or bursting of the plastic package because of the "popcorn effect" when heating, does not therefore occur so easily in the component according to the described device.

A method for producing a semiconductor component including at least one semiconductor chip comprises: preparing a semiconductor chip with an active upper side including a plurality of electrical chip contacts and preparing a mounting substrate with a plurality of electrical contacts, e.g., a rewiring substrate or a lead frame.

The semiconductor chip is applied via its passive rear side to the mounting substrate, and the electrical chip contacts on the active upper side are electrically connected to the electrical contacts on the mounting substrate via bonding wires.

A solderable interlayer is subsequently applied to the active upper side while avoiding the electrical contacts and a heat sink, e.g., made of metal, is soldered to the solderable interlayer.

Before or after the heat sink is soldered on, the semiconductor component may be provided with a plastic package. To this end, the semiconductor chip and the bonding wires as well as parts of the mounting substrate and optionally part of the heat sink are encapsulated with a plastic package compound. If the heat sink is not intended to be soldered on until after the encapsulation, an opening in the plastic package is kept free such that the heat sink can be subsequently inserted into the opening.

Installing the heat sink after encapsulating the semiconductor component with the plastic compound has the advantage that the heat sink is not contaminated by the plastic compound. Since it is not necessary to seal the upper side of the heat sink during the encapsulation, it is also possible to use heat sinks with very different structures, in particular very different surfaces.

In the following paragraphs, exemplary embodiments of the device and method are described in connection with the figures. In all the figures, parts which are the same are provided with the same reference numerals.

The semiconductor component 1 according to FIG. 1 comprises a semiconductor chip 2, with an active upper side 3, arranged on a mounting substrate 4. The mounting substrate 4 may, e.g., be a rewiring substrate or a lead frame.

The semiconductor chip 2 comprises a plurality of electrical contacts 10 on its active upper side, which are electrically connected via bonding wires 6 to electrical contacts 5 on the mounting substrate. To this end, the semiconductor chip 2 is arranged with its rear side on the mounting substrate 4 such that bonding wires 6 can be drawn from the active upper side 3 to the mounting substrate 4.

During operation of the semiconductor component 1, and especially on the active upper side 3 of the semiconductor chip 2, heat is generated which must be dissipated to avoid failure of the semiconductor component 1. Since the semiconductor substrate of the semiconductor chip 2, largely comprised of, for example silicon, is a poor conductor of heat, it is expedient to dissipate the heat via a heat sink arranged precisely where the heat is generated, i.e. on the active upper side 3 of the semiconductor chip.

Particularly effective dissipation of the heat is achieved via soldering the heat sink onto the active upper side 3 instead of adhesively bonding it, since a soldered connection generally conducts heat better than adhesives do.

The active upper side 3 of the semiconductor chip 2 must be provided with a solderable interlayer 7 before a heat sink is soldered in place. The solderable interlayer 7 is disposed on the active upper side 3 before or after the semiconductor chip 2 is mounted on the mounting substrate 4. The solderable interlayer 7 must on the one hand exhibit good properties of adhesion on the material of the active upper side 3, which may for example be $SiO_2$, and on the other hand provide a solderable surface for soldering a heat sink 9 thereto.

The solderable interlayer 7 must also be applied on the active upper side 3 while leaving the electrical contacts 10 of the semiconductor chip 2 free, such that contacting of the semiconductor chip 2 by bonding wires 6 is not impeded. Nevertheless, as large of an area as possible should be made available for the solderable interlayer 7 on the active upper side 3 of the semiconductor chip 2 in order to ensure effective dissipation of the heat.

The solderable interlayer 7 is therefore expediently applied onto a region of the upper side 3 which does not comprise any electrical contacts 10, e.g., onto the central region.

Figure 2:
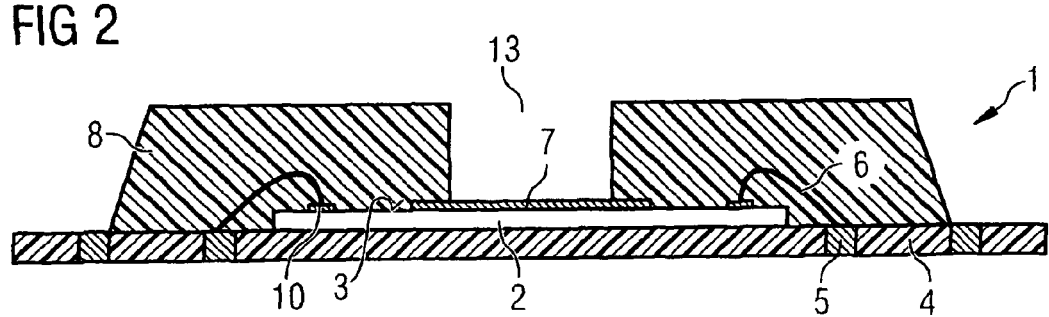
FIG. 2 shows the semiconductor chip after encapsulation with a plastic package compound.
Figure 3:
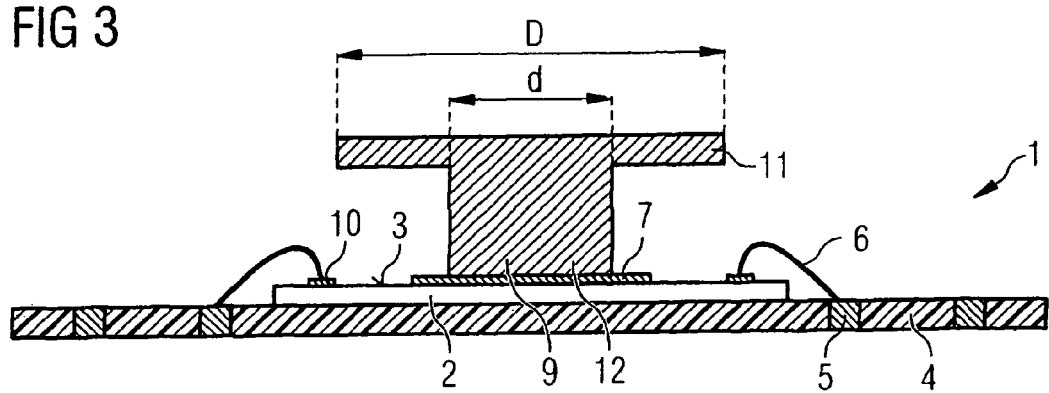

The semiconductor component 2 may be encapsulated with a plastic package 8 after applying the solderable interlayer 7, as represented in FIG. 2. Alternatively, the heat sink 9 may also be soldered onto the solderable interlayer 7 prior to the encapsulation, as represented in FIG. 3.

The heat sink 9 comprises an upper part 11, which typically protrudes from the plastic package 8, and a lower part 12 which is enclosed by the plastic package 8. The upper part 11 having a width D from which the cross-sectional area A is obtained as a function of the geometry of the heat sink 9. The lower part 12 has a width d and a cross-sectional area a. The widths D and d may be equal, or alternatively they may be different. While the purpose of the upper part 11 is to release the heat to the surroundings, the purpose of the lower part 12 is to conduct the heat from the active upper side 3 of the semiconductor chip 2 into the upper part 11.

If the semiconductor component 1 is first encapsulated with the semiconductor package 8, the solderable surface 7 or parts of it are expediently kept free during the encapsulation, so as to form an opening 13 into which the heat sink 9 can subsequently be easily fitted. In this case, the heat sink 9 is soldered onto the solderable interlayer 7. This method has the advantage that the heat sink 9 cannot be contaminated by the plastic compound.

Figure 4:
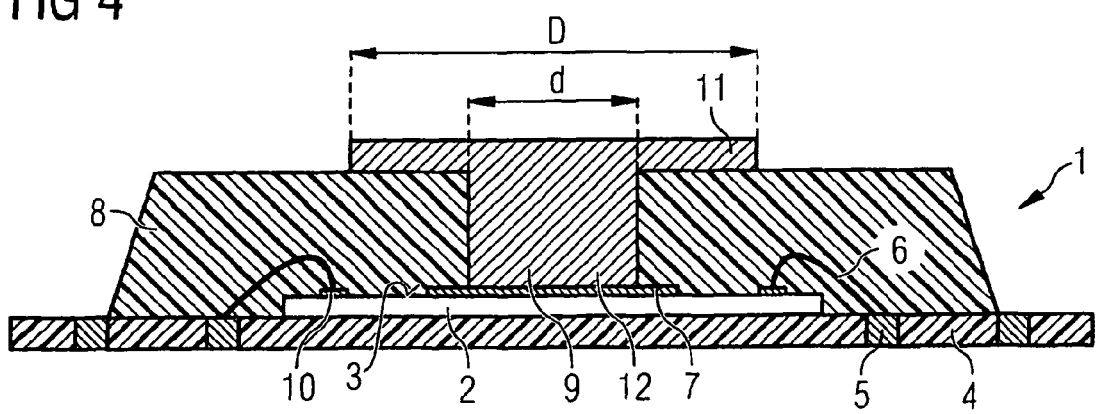
FIG. 4 shows the semiconductor component with the heat sink and the plastic package.

FIG. 4 shows the semiconductor component 1 after the heat sink 9 has been soldered on and after encapsulation with the plastic package 8. For the heat sink 9 to provide maximally effective thermal dissipation, it must fulfill various requirements. The heat sink 9 should comprise a material which is a good conductor of heat, such as metal. On the one hand it must have a surface area large enough to be able to dissipate the generated heat as quickly as possible. On the other hand, since the heat sink 9 is arranged on the active upper side 3 of the semiconductor chip 2 on which it competes for limited space with the electrical contacts 10 and the bonding wires 6, the heat sink 9 must be shaped such that it does actually permit bonding via the bonding wires 6.

In the exemplary embodiments shown in FIGS. 3 and 4, these various requirements are accommodated in that the width D of the upper part 11 is greater than the width d of the lower part 12 such that the heat sink 9 has a smaller base area in the lower part 12 than in the upper part 11. The upper part 11 protrudes out of the plastic package 8 after the semiconductor component 1 has been encapsulated with the plastic package 8 and provides for the release of heat to the surroundings thereby, the electrical contacts 10 can be left free without being obstructed and the bonding wires 6 can circumvent the heat sink 9.

While the device and method have been described in detail with reference to specific embodiments thereof, it will be apparent to one of ordinary skill in the art that various changes and modifications can be made therein without departing from the spirit and scope thereof. Accordingly, it is intended that the described device and method covers the modifications and variations of the device and method provided they come within the scope of the appended claims and their equivalents.

What is claimed is:

1. A semiconductor component, comprising:
    a mounting substrate including mounting substrate electrical contacts;
    at least one semiconductor chip arranged on the mounting substrate and including an active upper side comprising a plurality of electrical contacts electrically connected via bonding wires to the mounting substrate electrical contacts, wherein at least a portion of the active upper side comprises $SiO_2$;
    a heat sink;
    a solderable interlayer arranged on the active upper side of the semiconductor chip without any intervening layer between the solderable interlayer and the active upper side, the solderable interlayer adhering to the $SiO_2$ of the active upper side, wherein the solderable interlayer comprises at least one of: nickel, a nickel-palladium alloy, and copper; and
    a plastic package enclosing the semiconductor chip, a portion of the heat sink and at least a portion of the mounting substrate, such that the solderable interlayer is disposed inside the semiconductor component;
    wherein the heat sink is connected via a soldered connection to the solderable interlayer and wherein at least a portion of the heat sink extends over an upper surface of the plastic package.

2. The semiconductor component as claimed in claim 1, wherein the heat sink comprises an upper part with an upper part cross-sectional area and a lower part with a lower part cross-sectional area, the upper part cross sectional area being greater than the lower part cross sectional area.

3. The semiconductor component as claimed in claim 1, wherein the heat sink is electrically connected to the semiconductor chip.

4. The semiconductor component as claimed in claim 1, wherein the mounting substrate is a rewiring substrate.

5. The semiconductor component as claimed in claim 1, wherein the mounting substrate is a lead frame.

6. A method for producing a semiconductor component including at least one semiconductor chip, the method comprising:
    preparing a semiconductor chip including an active upper side with a plurality of semiconductor chip electrical contacts, wherein at least a portion of the active upper side comprises $SiO_2$;
    preparing a mounting substrate including a plurality of mounting substrate electrical contacts;
    applying the semiconductor chip to the mounting substrate;
    electrically connecting the semiconductor chip electrical contacts to the mounting substrate electrical contacts via bonding wires;
    applying a solderable interlayer to the active upper side without forming any intervening layer between the solderable interlayer and the active upper side, such that the electrical chip contacts are avoided, the solderable interlayer adhering to the $SiO_2$ of the active upper side, wherein the solderable interlayer comprises at least one of: nickel, a nickel-palladium alloy, and copper;
    soldering a heat sink to the solderable interlayer; and
    encapsulating the semiconductor chip, a portion of the heat sink and at least a portion of the mounting substrate with a plastic package, such that the solderable interlayer is disposed inside the semiconductor component,
    wherein at least a portion of the heat sink extends over an upper surface of the plastic package.

7. The method as claimed in claim 6, wherein the heat sink is electrically connected to the semiconductor chip.

8. The semiconductor component of claim 2, wherein the lower part of the heat sink is enclosed by the plastic package and the upper part of the heat sink lies above the upper surface of the plastic package, at least a portion of the upper part of the heat sink being arranged on the upper surface of the plastic package.

9. The method of claim 6, further comprising:
    forming the heat sink with an upper part having an upper part cross-sectional area and a lower part having a lower part cross-sectional area, the upper part cross sectional area being greater than the lower part cross sectional area,
    wherein encapsulating a portion of the heat sink comprises encapsulating the lower part of the heat sink with the plastic package, the upper part of the heat sink lying above the upper surface of the plastic package, wherein at least a portion of the upper part of the heat sink is arranged on the upper surface of the plastic package.

10. The component as claimed in claim 1, wherein the mounting substrate is a poor conductor of heat.

11. The component as claimed in claim 2, wherein the upper part of heat sink includes upper and side surfaces that are exposed.

12. The method as claimed in claim 6, wherein the mounting substrate is a poor conductor of heat.

13. The method as claimed in claim 9, wherein the upper part of heat sink is formed to include upper and side surfaces that are exposed.

* * * * *